United States Patent
Cohen (10) Patent No.: US 11,860,551 B2
(45) Date of Patent: Jan. 2, 2024

(54) SYSTEM AND METHOD FOR DETECTING RARE STOCHASTIC DEFECTS

(71) Applicant: Applied Materials Israel Ltd., Rehovot (IL)

(72) Inventor: Guy Cohen, Yaad (IL)

(73) Assignee: Applied Materials Israel Ltd., Rehovot (IL)

( * ) Notice: Subject to any disclaimer, the term of this patent is extended or adjusted under 35 U.S.C. 154(b) by 194 days.

(21) Appl. No.: 17/445,026

(22) Filed: Aug. 13, 2021

(65) Prior Publication Data

US 2021/0373441 A1     Dec. 2, 2021

Related U.S. Application Data

(63) Continuation of application No. PCT/US2020/018147, filed on Feb. 13, 2020.
(Continued)

(51) Int. Cl.
*H01J 37/22* (2006.01)
*G03F 7/00* (2006.01)

(52) U.S. Cl.
CPC .......... *G03F 7/7065* (2013.01); *H01J 37/222* (2013.01); *H01J 2237/24592* (2013.01)

(58) Field of Classification Search
CPC ................ G03F 7/7065; H01J 37/222; H01J 2237/24592; H01J 2237/2817
See application file for complete search history.

(56) References Cited

U.S. PATENT DOCUMENTS 6,171,737 B1 * 1/2001 Phan ................ H01L 22/34
                                                 430/30
2008/0099438 A1   5/2008 Chen
(Continued)

FOREIGN PATENT DOCUMENTS

| CN | 104062305 A | 9/2014 |
| WO | 2018/191072 A1 | 10/2018 |
| WO | 2019/011604 A1 | 1/2019 |

OTHER PUBLICATIONS

Sah et al. 'EUV stochastic defect monitoring with advanced broadband optical wafer inspection and e-beam review systems' Proc. SPIE 10809, International Conference on Extreme Ultraviolet Lithography 2018, 108909 (Oct. 3, 2018) (Year: 2018).*
(Continued)

*Primary Examiner* — Eliza W Osenbaugh-Stewart
(74) *Attorney, Agent, or Firm* — Kilpatrick Townsend & Stockton LLP (57) ABSTRACT

A method for detecting a rare stochastic defect, the method may include searching for a rare stochastic defect in a dense pattern of a substrate, wherein the rare stochastic defect is (a) of nanometric scale, (b) appears in a functional pattern of the substrate with a defect density that is below $10^{-9}$, and (c) appears in the dense pattern with a defect density that is above $10^{-7}$; wherein the dense pattern is a dense representation of the functional pattern that differs from the functional pattern by at least one out of (a) a distance between features of the dense pattern, and (b) a width of the features of the dense pattern; and estimating the occurrence of the rare stochastic defect within the functional pattern based on an outcome of the searching.

15 Claims, 5 Drawing Sheets

---

Searching stochastic defects in targets of dense patterns. The dense patterns are denser than functional patterns located outside the targets. Functional means that the pattern are used during the operation of the dies. The targets are usually dedicated to the test. 22

↓

Estimating the occurrence of rare stochastic defects outside the targets based on the outcome of step 22. 24

↓

Responding to the estimation. 26

Related U.S. Application Data (60) Provisional application No. 62/810,116, filed on Feb. 25, 2019.

(56) References Cited

U.S. PATENT DOCUMENTS

| | | | |
|---|---|---|---|
| 2015/0060667 A1 | 3/2015 | Yamaguchi et al. | |
| 2016/0110488 A1 | 4/2016 | Hansen | |
| 2018/0300870 A1 | 10/2018 | Park et al. | |
| 2018/0348641 A1 | 12/2018 | Kim | |
| 2021/0396692 A1* | 12/2021 | Fukuda | G01N 23/18 |

OTHER PUBLICATIONS

International Preliminary Report on Patentability for Application No. PCT/US2020/018147, dated Sep. 2, 2021, 6 pages.

De Bisschop et al., "EUV lithography: sailing along the stochastic cliffs," Semiconductor technology & processing, 2019, 12 pages.

Leachman, R. et al., "Benchmarking Semiconductor Manufacturing," Competitive Semiconductor Manufacturing Program Engineering Systems Research Center, University of California at Berkeley, IEEE Transactions on Semiconductor Manufacturing, Nov. 1997, 10 pages.

* cited by examiner

SYSTEM AND METHOD FOR DETECTING RARE STOCHASTIC DEFECTS

CROSS REFERENCE TO RELATED APPLICATIONS

This application is a continuation of International Application No. PCT/US2020/018147, filed Feb. 13, 2020, which claims the benefit of U.S. Provisional Application No. 62/810,116, filed Feb. 25, 2019, the entire contents of which are incorporated herein by reference for all purposes.

BACKGROUND

Extreme ultra violet (EUV) Lithography generate rare stochastic defects. Only few rare stochastic defects can be allowed per substrate. The number of allowed rare stochastic defects per substrate may be defined in various manners and by various entities—for example the manufacturer of the substrate, a customer, a designer of the substrate, and the like.

A rate rare stochastic defect may have a defect density that does not exceed $10^{-9}$. A rare stochastic defect is of nanometric scale (has nanometric dimensions) and may include cuts, unwanted bridges between lines, missing dots, unwanted bridges between dots, and the like.

The rare stochastic defects are of nanometric scale and are too small to be detected by optical tools. The rare nature of the rare stochastic defects requires a charged particle beam tool to scan the entire substrate in order to detect the rare stochastic defects—as only few rare stochastic defects are expected to exist per wafer. The scanning of the entire substrate is time consuming and impractical.

There is a growing need to provide an efficient, fast, and reliable way to detect rare stochastic defects.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a computer readable medium that is non-transitory and stores instructions for executing the method.

Any reference in the specification to a system should be applied mutatis mutandis to a method that may be executed by the system and should be applied mutatis mutandis to a computer readable medium that is non-transitory and stores instructions executable by the system.

Any reference in the specification to a computer readable medium that is non-transitory should be applied mutatis mutandis to a method that may be applied when executing instructions stored in the computer readable medium and should be applied mutatis mutandis to a system configured to execute the instructions stored in the computer readable medium.

There may be provided a system, a method, and a computer readable medium for detecting rare stochastic defects.

The rare stochastic defects have a statistics (probability of occurrence) which is proportional to the size of the pattern under consideration e.g. line or space width or hole or pillar radius.

The substrate may be a semiconductor wafer.

The substrate may be manufactured to include one or more targets—each target includes one or more dense patterns. The density of the dense patterns dramatically increases the chances of occurrence the rate stochastic defects in the one or more targets—and thus dramatically increases the chances of detecting the rate stochastic defects in the one or more targets.

TABLE 1 illustrates an example of a relationship between pattern width and defect density (which is a function of the probability of occurrence of stochastic defects and may reflect number of defects per area, per patterns, and the like). A pattern may include multiple features (a feature may be a line, a dot, and the like) and the width listed in TABLE 1 may be (a) a width of the feature, or (b) a distance between adjacent features.

TABLE 1

| Pattern width [Nanometer] | Defect density |
| --- | --- |
| 30 | $10^{-14}$ |
| 29 | $10^{-13}$ |
| 28 | $10^{-12}$ |
| 27 | $10^{-11}$ |
| 26 | $10^{-10}$ |
| 25 | $10^{-9}$ |
| 24 | $10^{-8}$ |

TABLE 1-continued

| Pattern width [Nanometer] | Defect density |
|---|---|
| 23 | $10^{-7}$ |
| 22 | $10^{-6}$ |
| 21 | $10^{-5}$ |
| 20 | $10^{-4}$ |

For example—assuming that a desired pattern width is 30 nanometer and the defect density (in a functional pattern—a pattern of the desired width) should not exceed $10^{-13}$—then at a target that includes dense patterns of width of 20 nanometer the defect density should not exceed $10^{-5}$.

Thus—by changing the pattern width from 30 nanometer to 20 nanometer—the probability of finding the defects was increased by a factor of about $10^8$.

The one or more targets may cover a very small fraction (below one percent, below ten percent, and the like) of the entire substrate—and the one or more targets can be scanned by charged particle tools in a reasonable amount of time.

The patterns of the targets may of any shape—for example an array of lines (or other structures) that is large enough for a meaningful statistics of defects to be collected, in which the space width is reduced by some percent.

Figure 1:
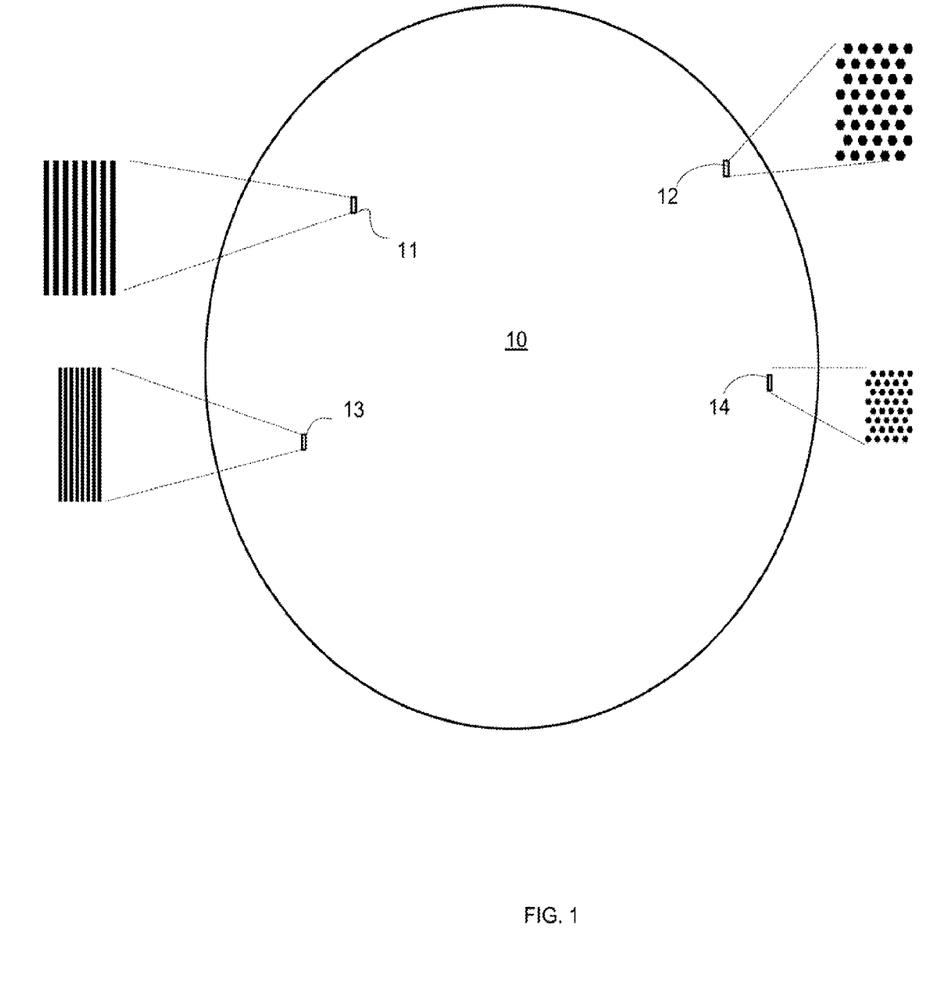
FIG. 1 illustrates an example of a substrate.

FIG. 1 illustrates a substrate 10, a first type of functional patterns 11, second type of functional patterns 12, targets of first type (such as an array of dense lines) 13, and targets of second type (such as an arrays of dots) 14.

Figure 2:
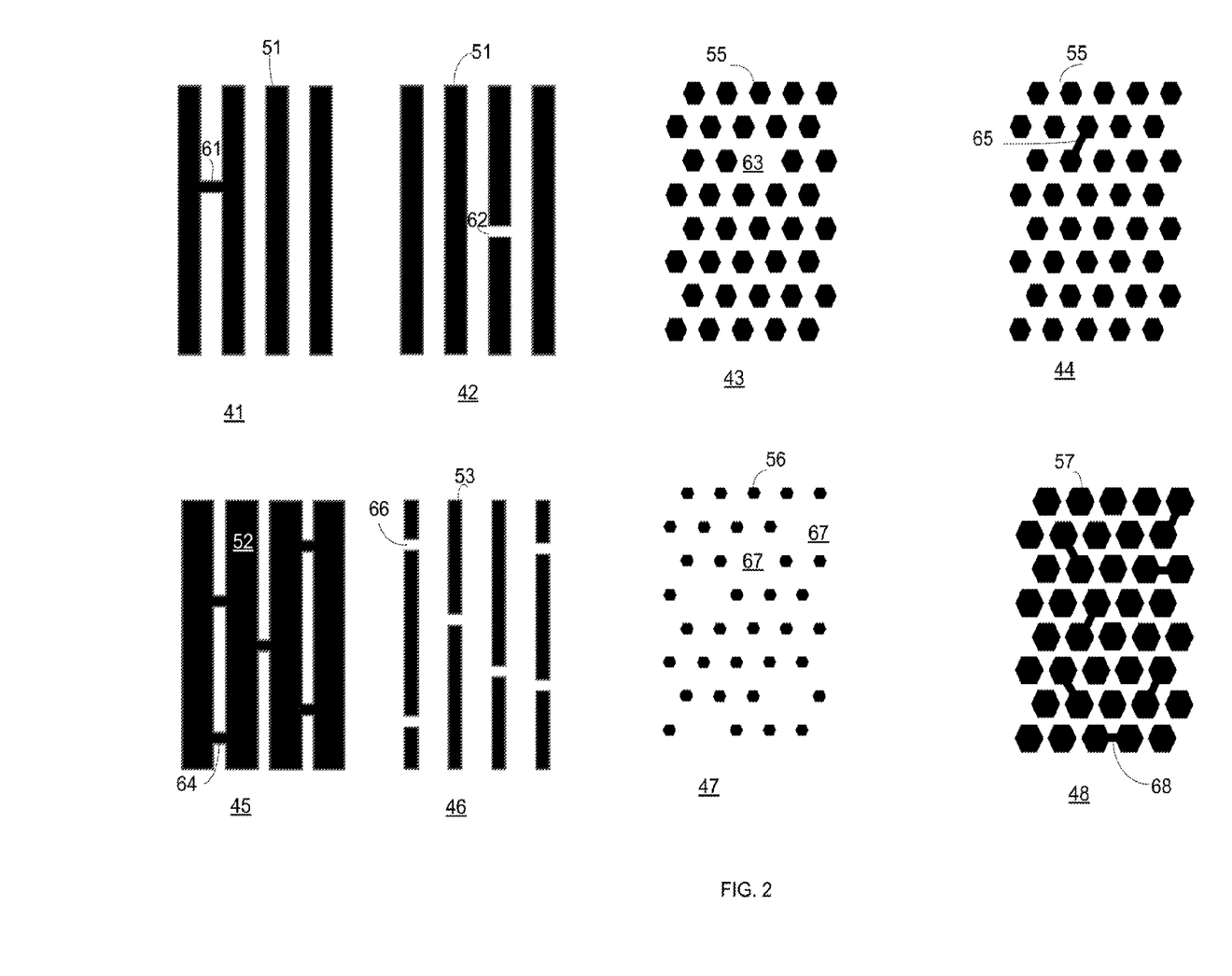
FIG. 2 illustrates different types of rare stochastic defects.

FIG. 2 illustrates different types of rare stochastic defects.

FIG. 2 include parts of different patterns that include rare stochastic defects.

A part of first pattern 41 includes a part of an array of lines 51 and an unwanted bridge 61.

A part of second pattern 42 includes a part of an array of lines 51, and a cut 62.

A part of third pattern 43 includes a part of an array of dots 55, and a missing dot 63.

A part of fourth pattern 44 includes a part of an array of dots 55, and an unwanted bridge 64.

A part of fifth pattern 45 includes a part of an array of lines 52, and an unwanted bridge 65.

A part of sixth pattern 46 includes a part of an array of lines 53, and a cut 66.

A part of seventh pattern 47 includes a part of an array of dots 56, and missing dots 67.

A part of eighth pattern 48 includes a part of an array of dots 57, and unwanted bridges 68.

Figure 3:
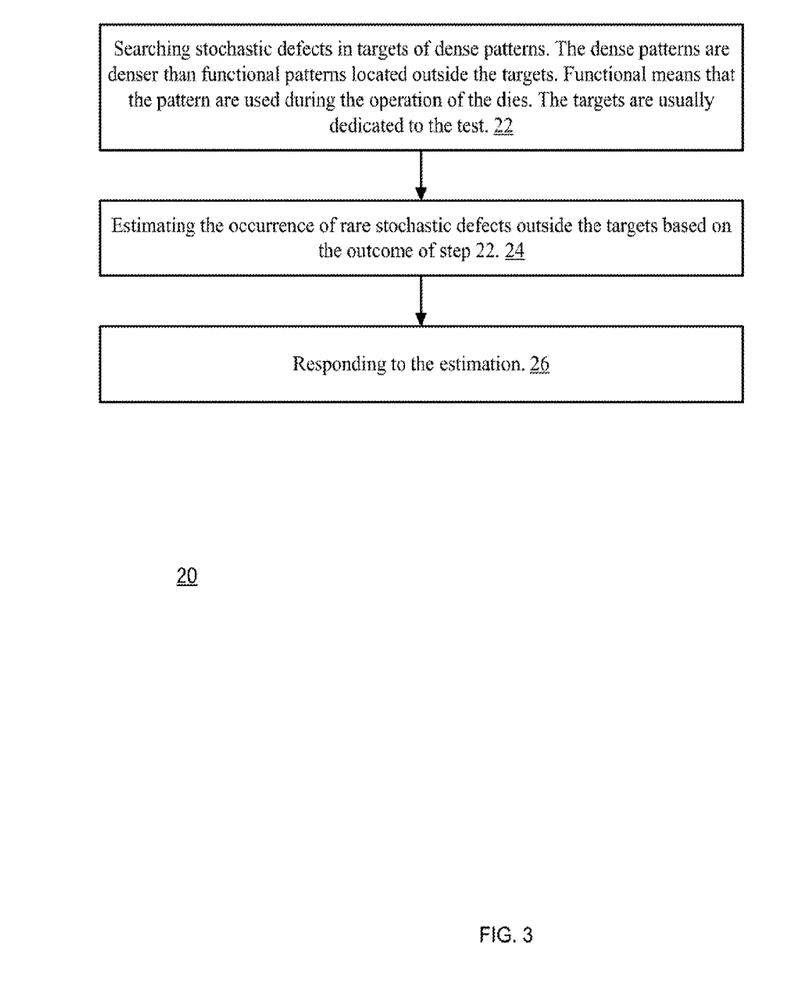
FIG. 3 illustrates an example of a method.

FIG. 3 illustrates a method 20 that includes a sequence of steps. The steps may include:

Step 22 of searching stochastic defects in targets of dense patterns. The dense patterns are denser than functional patterns located outside the targets. Functional means that the pattern are used during the operation of the dies. The targets are usually dedicated to the test.

Step 24 of estimating the occurrence of rare stochastic defects outside the targets based on the outcome of step 22.

Step 26 of responding to the estimation—for example defining the substrate as a defective substrate or not based on the estimation of step 24. For example comparing the estimated defect density to an allowable defect threshold and determine whether the substrate is acceptable or defective.

Figure 4:
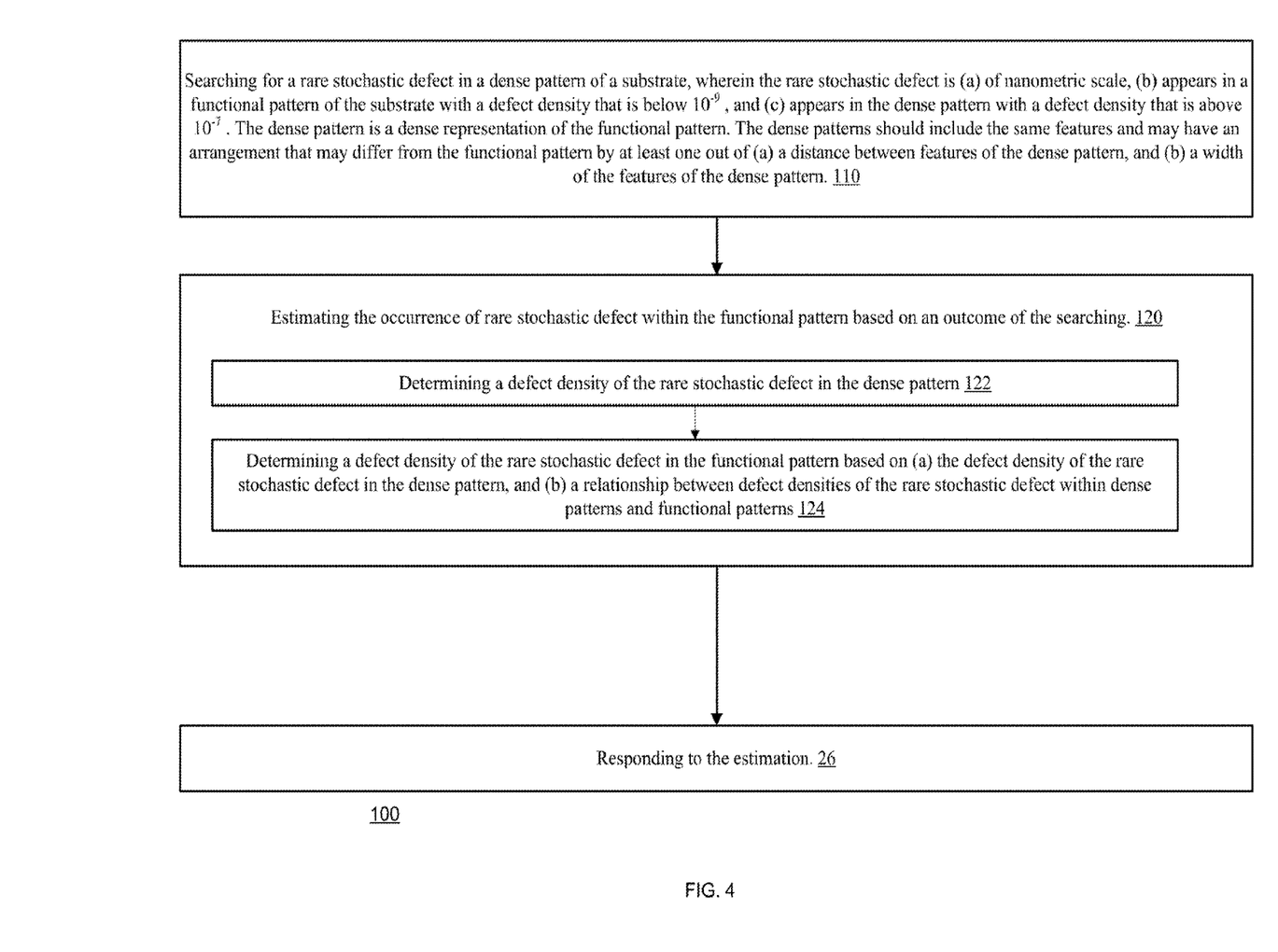
FIG. 4 illustrates an example of a method.

FIG. 4 illustrates method 100 for detecting a rare stochastic defect.

Method 100 may start by step 110 of searching for a rare stochastic defect in a dense pattern of a substrate, wherein the rare stochastic defect is (a) of nanometric scale, (b) appears in a functional pattern of the substrate with a defect density that is below $10^{-9}$, and (c) appears in the dense pattern with a defect density that is above 10'.

Step 110 may include illuminating the dense pattern by a charged particle beam and generating images of the dense pattern (an image may cover at least a part of the entire dense pattern).

Alternatively—step 110 may include receiving (for example by a remote computer that does not belong to a charger particle system) information about the dense pattern. The information may include one or more images of the dense pattern.

The dense pattern is a dense representation of the functional pattern. The dense patterns should include the same features and may have an arrangement that may differ from the functional pattern by at least one out of (a) a distance between features of the dense pattern, and (b) a width of the features of the dense pattern.

Assuming that the functional pattern includes an array of lines—then a corresponding dense pattern will include a denser array of lines. The width of the lines of the dense pattern may be smaller than the width of lines of the functional pattern. Additionally or alternatively, the distance between adjacent lines of the dense pattern may be smaller than the distance between adjacent lines of the functional pattern.

Assuming that the functional pattern includes an array of dots—then a corresponding dense pattern will include a denser array of the dots. The width of the dots of the dense pattern may be smaller than the width of the dots of the functional pattern. Additionally or alternatively, the distance between adjacent dots of the dense pattern may be smaller than the distance between adjacent dots of the functional pattern.

The dense pattern and the functional pattern may be arrays of lines.

Step 110 may include searching for at least one out of a cut within a line, and an unwanted bridge between lines.

The dense pattern and the functional pattern may be arrays of dots.

Step 110 may include searching for at least one out of a missing dot and an unwanted bridge between dots.

Step 110 may be followed by step 120 of estimating the occurrence of the rare stochastic defect within the functional pattern based on an outcome of the searching.

The estimating may include determining the defect density of the rare stochastic defect within functional patterns that span over the substrate or span over one or more parts of the substrate.

Step 120 may include step 122 of determining a defect density of the rare stochastic defect in the dense pattern, and step 124 of determining a defect density of the rare stochastic defect in the functional pattern based on (a) the defect density of the rare stochastic defect in the dense pattern, and (b) a relationship between defect densities of the rare stochastic defect within dense patterns and functional patterns. An example of the relationship is illustrated in TABLE 1.

Step 120 may be followed by step 130 of responding to the outcome of step 120.

Step 130 may include evaluating a quality of the substrate based on the occurrence of the rare stochastic defect within the functional pattern.

Step 130 may include disqualifying a substrate if a defect density of the rare stochastic defect within the functional pattern exceeds a predefined threshold. The predefined threshold may be defined by a manufacturer of the substrate, a customer, and the like.

While method 100 was illustrated in relation to a test pattern and a rare stochastic defect, method may be applied on multiple dense patterns, and the searching may include searching for different types of rare stochastic defects. It should be noted that different rare stochastic defects may be searched in a single dene pattern.

For example—a dense pattern of lines may be searched (during step 110) for cut within a line, and/or for an unwanted bridge between lines.

Yet for another example—a dense pattern of does may be searched (during step 110) for missing dot and/or for an unwanted bridge between dots.

For example step 130 may be followed by selecting another dense pattern and repeating steps 110, 120 and 130 for one or more other rare stochastic defects.

Accordingly, during a next repetition of method 100, step 110 may include searching for another rare stochastic defect in another dense pattern of the substrate; wherein the other rare stochastic defect appears in another functional pattern of the substrate with a defect density that is below $10^{-9}$ and appears in the other dense pattern with a defect density that is above 10'; wherein the searching comprises illuminating the other dense pattern by the charged particle beam; wherein the other dense pattern is a dense representation of the other functional pattern that differs from the other functional pattern by at least one out of (a) a distance between features of the other dense pattern, and (b) a width of the features of the other dense pattern; wherein the other rare stochastic defect differ from rare stochastic defect by type.

During the next repetition of method 100, step 120 will include estimating the occurrence of the other rare stochastic defect within the other functional pattern based on an outcome of the searching for the other rare stochastic defect.

Step 110 may be executed by a system that may be a charged particle system. It should be noted that steps 120 and 130 may be executed by the system or by another system—for example by a remote computer.

Figure 5:
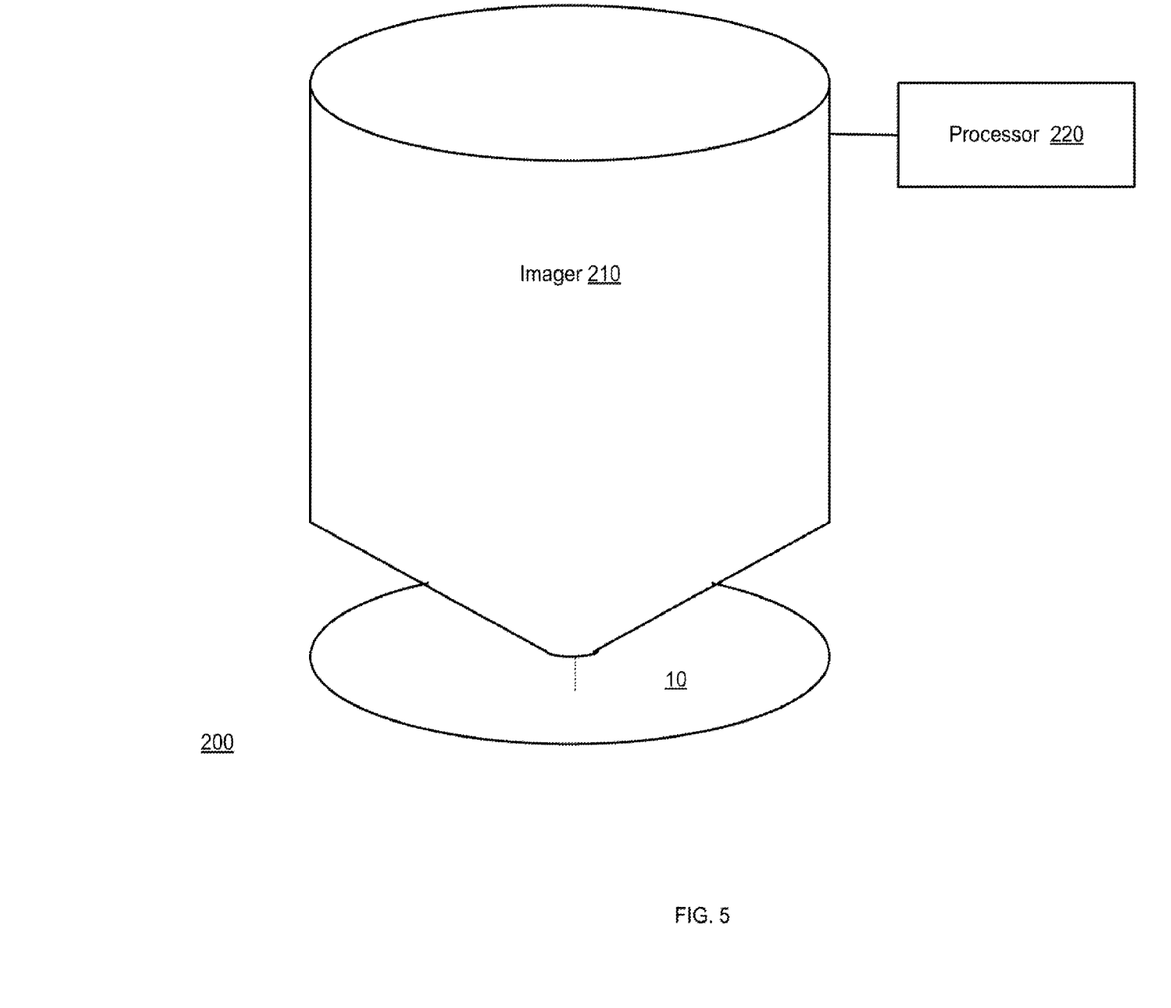
FIG. 5 illustrates an example of a system.

FIG. 5 illustrates an example of a system 200.

FIG. 200 includes imager 210 and a processor 220.

The imager 210 may be an electron beam imager, an electron beam microscope, an ion microscope, an ion imager, and the like. The electron beam microscope can be a scanning electron microscope, a transmission electron microscope, and the like.

System 200 may be configured to execute method 20 and, additionally or alternatively may be configured to execute method 100.

For example—imager 210 may be configured to illuminate with a charge particle beam, a dense pattern of a substrate and generate images of the dense pattern.

Processor 220 may be configured to:

Search for a rare stochastic defect in the dense pattern based on an outcome of the illumination of the dense pattern, wherein the rare stochastic defect appears in a functional pattern of the substrate with a defect density that is below $10^{-9}$ and appears in the dense pattern with a defect density that is above $10^{-7}$. The dense pattern is a dense representation of the functional pattern that differs from the functional pattern by at least one out of (a) a distance between features of the dense pattern, and (b) a width of the features of the dense pattern.

An estimate an occurrence of the rare stochastic defect within the functional pattern based on an outcome of the searching.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A method for detecting a rare stochastic defect, the method comprising:
    searching for a rare stochastic defect in a dense pattern of a substrate, wherein the rare stochastic defect is (a) of nanometric scale, (b) appears in a functional pattern of the substrate with a defect density that is below $10^{-9}$, and (c) appears in the dense pattern with a defect density that is above $10^{-7}$; wherein the dense pattern is a dense representation of the functional pattern that differs from the functional pattern by at least one out of (a) a distance between features of the dense pattern, and (b) a width of the features of the dense pattern; and
    estimating an occurrence of the rare stochastic defect within the functional pattern based on an outcome of the searching.

2. The method according to claim 1 wherein the estimating comprises:
    determining a defect density of the rare stochastic defect in the dense pattern; and
    determining a defect density of the rare stochastic defect in the functional pattern based on (a) the defect density of the rare stochastic defect in the dense pattern, and (b) a relationship between defect densities of the rare stochastic defect within dense patterns and functional patterns.

3. The method according to claim 1 wherein the dense pattern and the functional pattern are arrays of lines, and searching for the rare stochastic defect comprises searching for at least one out of a cut within a line, and an unwanted bridge between lines.

4. The method according to claim 1 wherein the dense pattern and the functional pattern are arrays of dots, and searching for the rare stochastic defect comprise searching for at least one out of a missing dot and an unwanted bridge between dots.

5. The method according to claim 1, comprising evaluating a quality of the substrate based on the occurrence of the rare stochastic defect within the functional pattern, wherein evaluating the quality of the substrate comprises disqualifying a substrate if a defect density of the rare stochastic defect within the functional pattern exceeds a predefined threshold.

6. The method according to claim 1, comprising: responding to the occurrence of the rare stochastic defect within the functional pattern by comparing an estimated defect density in the functional pattern to an allowable defect threshold in the functional pattern and determining whether the substrate is acceptable or defective.

7. The method according to claim 1 wherein the searching comprises illuminating the dense pattern by a charged particle beam.

8. The method according to claim 1, comprising:
    searching for another rare stochastic defect in another dense pattern of the substrate; wherein the other rare stochastic defect appears in another functional pattern of the substrate with a defect density that is below $10^{-9}$ and appears in the other dense pattern with a defect density that is above $10^{-7}$; wherein the other dense pattern is a dense representation of the other functional pattern that differs from the other functional pattern by at least one out of (a) a distance between features of the other dense pattern, and (b) a width of the features of the other dense pattern; wherein the other rare stochastic defect differ from rare stochastic defect by type; and
    estimating the occurrence of the other rare stochastic defect within the other functional pattern based on an outcome of the searching for the other rare stochastic defect.

9. The method according to claim 8 wherein searching for another rare stochastic defect comprises illuminating the other dense pattern by a charged particle beam.

10. A computer readable medium that is not transitory and stores instructions for
    searching for a rare stochastic defect in a dense pattern of a substrate, wherein the rare stochastic defect appears in a functional pattern of the substrate with a defect density that is below $10^{-9}$ and appears in the dense pattern with a defect density that is above $10^{-7}$; wherein the dense pattern is a dense representation of the functional pattern that differs from the functional pattern by at least one out of (a) a distance between features of the dense pattern, and (b) a width of the features of the dense pattern; and
    estimating an occurrence of the rare stochastic defect within the functional pattern based on an outcome of the searching.

11. A system for detecting a rare stochastic defect, the system comprises:
    an imager that is configured to illuminate with a charge particle beam, a dense pattern of a substrate and generate images of the dense pattern;
    a processor that is configured to:
        search for a rare stochastic defect in the dense pattern based on an outcome of the illumination of the dense pattern, wherein the rare stochastic defect appears in a functional pattern of the substrate with a defect density that is below $10^{-9}$ and appears in the dense pattern with a defect density that is above $10^{-7}$; wherein the dense pattern is a dense representation of the functional pattern that differs from the functional pattern by at least one out of (a) a distance between features of the dense pattern, and (b) a width of the features of the dense pattern; and
        estimate an occurrence of the rare stochastic defect within the functional pattern based on an outcome of the searching.

12. The system according to claim 11 wherein the processor is configured to:
   determine a defect density of the rare stochastic defect in the dense pattern; and
   determine a defect density of the rare stochastic defect in the functional pattern based on (a) the defect density of the rare stochastic defect in the dense pattern, and (b) a relationship between defect densities of the rare stochastic defect within dense patterns and functional patterns.

13. The system according to claim 11 wherein the processor is configured to evaluate a quality of the substrate based on the occurrence of the rare stochastic defect within the functional pattern, wherein evaluation of a quality of the substrate comprises disqualifying a substrate if a defect density of the rare stochastic defect within the functional pattern exceeds a predefined threshold.

14. The system according to claim 11 wherein the processor is configured to respond to the occurrence of the rare stochastic defect within the functional pattern by comparing an estimated defect density in the functional pattern to an allowable defect threshold in the functional pattern and determining whether the substrate is acceptable or defective.

15. The system according to claim 11 wherein the imager is configured to illuminate with the charge particle beam, another dense pattern of the substrate and generate images of the other dense pattern; and
   wherein the processor is configured to:
      search for another rare stochastic defect in another dense pattern of the substrate; wherein the other rare stochastic defect appears in another functional pattern of the substrate with a defect density that is below $10^{-9}$ and appears in the other dense pattern with a defect density that is above $10^{-7}$; wherein the other dense pattern is a dense representation of the other functional pattern that differs from the other functional pattern by at least one out of (a) a distance between features of the other dense pattern, and (b) a width of the features of the other dense pattern; wherein the other rare stochastic defect differ from rare stochastic defect by type; and
      estimate the occurrence of the other rare stochastic defect within the other functional pattern based on an outcome of the searching for the other rare stochastic defect.

* * * * *